United States Patent
Bagley et al.

(10) Patent No.: US 7,587,812 B2
(45) Date of Patent: Sep. 15, 2009

(54) ELECTRONIC DEVICE MANUFACTURING COMPONENT WITH AN EMBEDDED CHIP AND METHODS OF USING THE SAME

(75) Inventors: William Allan Bagley, Tokyo (JP); Paohuei Lee, Fremont, CA (US); Suhail Anwar, San Jose, CA (US); Janusz Jozwiak, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 11/672,441

(22) Filed: Feb. 7, 2007

(65) Prior Publication Data

US 2007/0197062 A1    Aug. 23, 2007

Related U.S. Application Data

(60) Provisional application No. 60/771,227, filed on Feb. 7, 2006.

(51) Int. Cl.
*H01R 13/04* (2006.01)
(52) U.S. Cl. .................................... 29/729
(58) Field of Classification Search ............... None
See application file for complete search history.

(56) References Cited

U.S. PATENT DOCUMENTS

| | | | |
|---|---|---|---|
| 6,753,253 B1* | 6/2004 | Takahashi et al. | 438/676 |
| 2001/0008296 A1* | 7/2001 | Gelsomini et al. | 257/500 |
| 2002/0072135 A1* | 6/2002 | Adachi et al. | 438/15 |
| 2005/0095774 A1* | 5/2005 | Ushiku et al. | 438/222 |

* cited by examiner

*Primary Examiner*—Charles D. Garber
*Assistant Examiner*—Andre' C Stevenson
(74) *Attorney, Agent, or Firm*—Dugan & Dugan, PC

(57) ABSTRACT

Systems, methods, and apparatus are provided for including a chip embedded in components of electronic device manufacturing systems adapted to sense, store, and/or update at least one of identification, operational-related and process-related information associated with the components. In other aspects of the invention, a processing chamber component having an embedded chip with storage capacity is adapted to record at least one of identification, operational-related and process-related information associated with the component; and to communicate the information from the chip to enable determination of an operational state of the component. Numerous other aspects are disclosed.

20 Claims, 3 Drawing Sheets

ELECTRONIC DEVICE MANUFACTURING COMPONENT WITH AN EMBEDDED CHIP AND METHODS OF USING THE SAME

This application claims priority to U.S. Provisional Patent Application Serial No. 60/771,227, filed Feb. 7, 2006, the contents of which is hereby incorporated by reference herein in its entirety.

FIELD OF THE INVENTION

The present invention relates to electronic device manufacturing, and more specifically to systems and methods in which components used in the manufacturing or processing of electronic (e.g., semiconductor) devices are equipped with embedded chips.

BACKGROUND OF THE INVENTION

In semiconductor manufacturing, substrates (e.g., silicon wafers, glass) are typically processed in distinct processing chambers. Physical conditions within the processing chambers, such as temperature or pH, can be extreme during operation and/or at other times, and may stress components of or within the processing chambers, which may suffer degradation over prolonged exposure to such stress. While monitoring processes may be used to gauge levels of stress exposure for components of processing chambers (e.g., by determining a number of processing cycles that have occurred within a processing chamber), such system-level stress monitoring may be an unreliable technique for monitoring and determining degradation and/or defects in individual processing-chamber components.

SUMMARY OF THE INVENTION

In some aspects of the invention, a processing chamber is provided that includes a component for use during an electronic device manufacturing process performed within the processing chamber; and a chip embedded within the component. The chip is adapted to store or update at least one of identification, operational-related and process-related information associated with the component.

In some other aspects of the invention, a processing chamber is provided for use during an electronic device manufacturing process performed within the processing chamber. The processing chamber includes at least one of a supporting surface and a housing; and a chip embedded in the supporting surface or housing adapted to store or update at least one of identification, operational-related and process-related information associated with the component.

In yet other aspects of the invention, a method is provided for monitoring a component of an electronic device manufacturing processing chamber. The method includes installing a component having an embedded chip in the processing chamber, the embedded chip having storage capacity; recording at least one of identification, operational-related and process-related information associated with the component within the chip; and communicating the updated information from the chip to enable determination of an operational state of the component.

Other features and aspects of the present invention will become more fully apparent from the following detailed description, the appended claims and the accompanying drawings.

DETAILED DESCRIPTION

Processing chambers used in manufacturing electronic devices (e.g., microprocessors, flat panel displays, etc.) may include one or more components (e.g., substrate supports, sidewalls, shields) that have a limited operational life and/or are subject to degradation under physico-chemical conditions present within the processing chamber during operation and/or at other times. However, in conventional systems, a component that requires maintenance or replacement may not be immediately detected or, in overcompensation, may be prematurely changed or otherwise serviced based on a regularly scheduled maintenance routine.

The present invention provides a chamber component that includes a chip (e.g., an embedded chip) that may store and/or update information regarding one or more of: the component type identification data, maintenance operations performed on the component, processes performed and/or process conditions within the processing chamber in which the component is located. Exemplary chamber components that may be provided with such a chip include susceptors, liners, targets, backing plates, gas distribution plates, showerheads, heating elements, cooling elements or the like.

Figure 1:
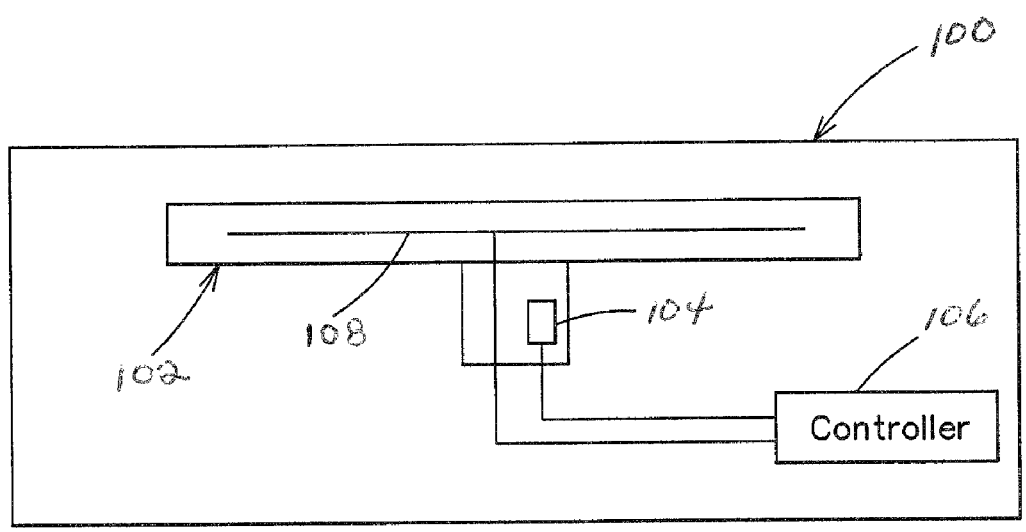
FIG. 1 is a schematic block diagram of an exemplary electronic device manufacturing processing chamber provided in accordance with an embodiment of the present invention.

FIG. 1 illustrates an exemplary electronic device manufacturing processing chamber 100 provided in accordance with an embodiment of the present invention. With reference to FIG. 1, the processing chamber 100 may include at least one component 102 having an embedded chip 104. For example, the processing chamber 100 may be part of a plasma enhanced chemical vapor deposition (PECVD) system, and the component 102 may be a susceptor included in the PECVD system. The chip 104 may be a microprocessor, microcontroller or the like, and may be coupled to (and/or embedded in) the component 102. The chip 104 may be further coupled to a controller 106 and communicate information to the controller 106 as described below. For example, the chip 104 may communicate with (and/or be coupled to) the controller 106 wirelessly, such as via RFID tagging or the like, or via one or more wires. The controller 106 may be internal or external to the chamber 100, and may be a microprocessor, microcontroller or the like.

The chip 104 may include one or more memory components (e.g., flash memory, DRAM, SRAM) and may be adapted to store and/or update identification, operational-related and/or process-related information associated with the component 102 (although the chip 104 may store and/or update a larger or smaller amount of and/or different type of information). For example, the chip 104 may be adapted to store and/or update identification information, such as component model number, size and/or manufacturer (although a larger or smaller amount of and/or different type of identification information may be stored and/or updated). The controller 106 may provide information to and/or access information from the chip 104. For instance, by accessing information from the chip 104, the controller 106 may determine what type of susceptor 102 is employed by (e.g., installed in) the processing chamber 100 without opening or otherwise disturbing the processing chamber 100.

Additionally or alternatively, the chip 104 may be adapted to store and/or update operational-related information, such as how long the component 102 has been in service, the date of the last maintenance performed on the component and/or the processing chamber, etc. (although a larger or smaller amount of and/or different type of operational-related information may be stored and/or updated). By accessing information from the chip 104, the controller 106 may determine whether the component 102 (e.g., susceptor) needs cleaning, servicing, replacement, etc. The controller 106 may display such information to a user, or employ an alarm to notify the user that the component needs cleaning, servicing, replacement, etc.

Additionally or alternatively, the chip 104 may be adapted to store and/or update process-related information, such as a number of times the component 102 (e.g., susceptor) has been heated to a processing temperature and/or cooled down to room temperature. (The susceptor may normally remain heated when the processing chamber 100 is running.) After a large number of heating up/cooling down cycles, the component 102 (e.g., susceptor) may become damaged or warped. Therefore, the controller 106 may determine the component 102 needs servicing, replacement, etc. based on such information. However, a larger or smaller amount of and/or different type of process-related information may be recorded. For example, the chip 104 may be adapted to record and/or update a number of arc conditions (e.g., arcing) in the processing chamber 100. Arcing may damage the susceptor or other components in the chamber 100. Therefore, the controller 106 may determine the component 102 needs servicing, repair, etc. based on such information.

In one or more embodiments in which the component 102 including an embedded chip 104 is a susceptor, the susceptor may include heating element 108 adapted to heat a substrate supported on the susceptor. For example, in one or more embodiments, the heating element 108, may be embedded within the susceptor. The heating element 108 also may be coupled to and controlled by the controller 106. In some embodiments, the embedded chip 104 may include one or more sensors, e.g., a temperature sensor, that may be used to detect a heating cycle. In other embodiments, the embedded chip 104 may receive one or more signals from the controller 106 indicating, for example, a heating cycle.

Through use of the present methods and apparatus, the chip 104 coupled to the component 102 of processing chamber 100 may sense, store and/or update identification, operational-related and/or process-related information associated with the component 102. Consequently, the component 102 of the processing chamber 100 may be identified without opening the chamber that houses the component 102. Further, a component 102 that requires maintenance or replacement may be detected (e.g., immediately).

Figure 2:
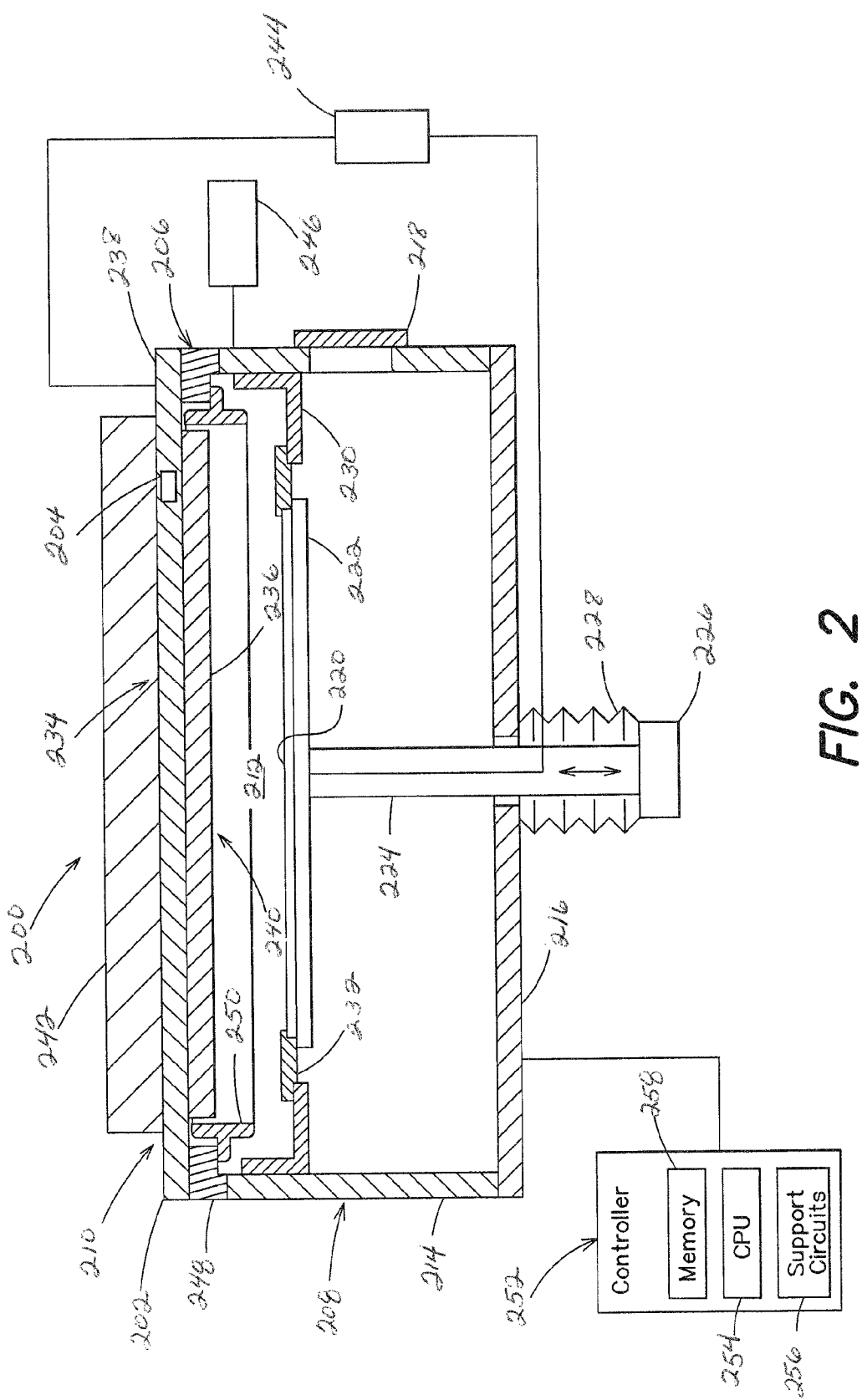
FIG. 2 is a cross-sectional elevation of another exemplary electronic device manufacturing processing chamber provided in accordance with an embodiment of the present invention.

FIG. 2 depicts an exemplary processing chamber 200, which may be, for example, a plasma vapor deposition (PVD) process chamber, available from AKT, Inc., of Santa Clara, Calif. Other types and models of processing chambers may be used. The processing chamber 200 may employ a component 202, such as a backing plate, having an embedded chip 204 as provided in accordance with an embodiment of the present invention. In the embodiment of FIG. 2, the processing chamber 200 includes a ground shield assembly 206.

The exemplary processing chamber 200 includes a chamber body 208 and a lid assembly 210 that define an evacuable process volume 212. The chamber body 208 may be fabricated from welded stainless steel plates or a unitary block of aluminum or any other material(s) that are stable and durable under the operating conditions of the processing chamber 200. The chamber body 102 generally includes sidewalls 214 and a bottom 216. The sidewalls 214 and/or bottom 216 generally contain a plurality of apertures that include an access port 218, such as a door and a pumping port (not shown). Other apertures, such as a shutter disk port (not shown) may also optionally be formed in the sidewalls 214 and or bottom 216 of the chamber body 208. The sealable access port 218 provides for entrance and egress of a substrate 220 to and from the process chamber 200. The pumping port is coupled to a pumping system (also not shown) that evacuates and controls the pressure within the process volume 212.

A substrate support 222 may be coupled to the bottom 216 of the chamber body 208 and may be have dimensions suitable for supporting the substrate 220 thereupon during processing. The substrate support 222 may be fabricated from e.g., aluminum, stainless steel, ceramic or combinations thereof. A shaft 224 may extend through the chamber bottom 216 and into the chamber body 208 and may couple the substrate support 222 to a lift mechanism 226. The lift mechanism 226 may include one or more motors adapted to move the substrate support 222 between a lower position and an upper position within the chamber body 208. The substrate support 222 is depicted in an intermediate position in FIG. 2. A flexible seal 228 (e.g., a bellows or bladder) may be positioned between the substrate support 222 and the chamber bottom 216 and may maintain vacuum integrity of the chamber volume 212.

A shielding bracket 230 and/or a shadow frame 232 may be disposed within the chamber body 208. The bracket 208 may be coupled, for example, to the sidewall 214 of the chamber body 208. The shadow frame 232 may be positioned over and/or surrounding the substrate 220 so as to block a portion of the substrate 220 and thereby confine deposition to an unblocked portion of the substrate 220 exposed through the shadow frame 232. When the substrate support 222 is moved to the upper position for processing, an outer edge of the substrate 220 disposed on the substrate support 222 may engage the shadow frame 232 and lift the shadow frame 232 from the bracket 230. Alternatively, shadow frames having other configurations may optionally be utilized as well.

In operation, the substrate support 222 is moved into the lower position for loading and unloading a substrate 220. In the lower position, the substrate support 222 may be positioned below the bracket 230 and the access port 218. The substrate 220 may then be removed from or placed into the processing chamber 200 through the access port 218 in the sidewall 214 while clearing the shadow frame 232 and bracket 162. Lift pins included in the substrate support 222 (not shown) may be selectively moved through the substrate support 222 to facilitate the placement or removal of the substrate 220 by a transfer mechanism disposed exterior to the process chamber 200 such as a single blade robot (not shown).

The lid assembly 210 may include a target assembly 234 having a target 236 coupled to a backing plate 202. The target 236 may also be coupled to the ground shield assembly 206 via the backing plate 202.

The target 236 provides material that may be deposited on the substrate 220 during a deposition process, such as, for example, PECVD or CVD. The target assembly 234 may also include a peripheral portion 238 and a central portion 240. The peripheral portion 238 may be disposed over the sidewalls 214 of the chamber. The central portion 240 of the target assembly 234 may extend towards the substrate support 212. It is contemplated that other target configurations may be utilized as well. For example, the target 236 may comprise a backing plate having a central portion of a desired material bonded or attached thereto. The target material may also comprise adjacent tiles or segments of material that together form the target. Optionally, the lid assembly 210 may further comprise a magnetron 242, which may enhances consumption and/or deposition of the target material during processing.

A potential gradient may be established in the process chamber 208 between the target 236 and the substrate support 222 by an electric power source 244. A gas, such as argon, may be supplied to the process volume 212 from a gas source 246 through one or more apertures (not shown) formed in the sidewalls 214 of the process chamber 200. In one or more deposition processes, such as PECVD, a plasma may formed from gas introduced into the process volume 212 between the substrate 212 and the target 236. Ions within the plasma may be accelerated toward the target 236 by the potential gradient established within the process chamber 208 and cause material to become dislodged from the target 236. The dislodged material may be attracted towards the substrate 220 from the target 236 by the potential gradient, causing a film to of target material to be formed on the substrate 220.

The ground shield assembly 206 may include a ground frame 248 and a ground shield 250. The ground shield 250 may be configured to surround the central portion 240 of the target 236 to define a processing region within the process volume 212. The ground shield 250 may also be coupled to the peripheral portion 238 of the target assembly 236 by the ground frame 248. The ground frame 248 may provide electrical insulation to the ground shield 250 from the target 236 while providing a ground path to the chamber body 208 of the processing chamber 200 (e.g., through the sidewalls 214). One benefit of attaching the ground shield 250 to the lid assembly 210 is that the ground shield 250 and the target 236 may be more easily and accurately aligned prior to placing the lid assembly 210 on the chamber body 208, thereby reducing the time required to align the ground shield 250 with respect to the target 236. Moreover, once the ground shield 250 is attached to the lid assembly 210, the lid assembly 210 may be easily placed on the chamber sidewalls 214 to complete assembly. Thus, the need to align the ground shield 250 and the target 236 after installation, which is required in many conventional processing chambers with adjustable target/ground shield arrangements, is eliminated. Moreover, the need for costly precise locating pins and/or parts, as is also required in many conventional processing chambers that do not have adjustable target/ground shield arrangements, is also eliminated.

The ground shield 250 constrains the plasma within the region circumscribed by the ground shield 250 to ensure that material is only dislodged from the central portion 240 of the target 236. The ground shield 250 may also facilitate deposition of the dislodged target material on the substrate 220. In this manner, efficient use of the target material is maximized and other regions of the chamber body 208 are protected from deposition or contamination from the dislodged species and/or from the plasma, thereby enhancing chamber component longevity and reducing the downtime and cost required to clean or otherwise maintain the processing chamber 200. Another benefit provided by this arrangement is that the number of particles that may become dislodged from the chamber body 208 (for example, due to flaking of deposited films or corrosion of the chamber body 208 from the plasma) and then re-deposited upon the surface of the substrate 220 may be reduced, thereby improving product quality and yield.

A controller 252 may interface with and control the process chamber 200. The controller 200 may comprises a central processing unit (CPU) 254, one or more support circuits 256 and one or more memory components 258. The CPU 254 may be one of any form of computer processor that can be used in an industrial setting for controlling various chambers and sub-processors. The one or more support circuits 256 may comprise cache units, power supplies, clock circuits, input/output circuitry, subsystems, and the like. The one or more memory components 258 may comprise any computer-readable medium, and may be one or more of any readily available memory such as random access memory (RAM), read only memory (ROM), floppy disk, hard disk, or any other form of digital storage, local or remote. The support components 256 and memory components 258 are coupled to the CPU 254. The controller 252 may be used to control operation of the process chamber 200, including any deposition processes performed therein.

As shown in FIG. 2, the backing plate 202 may include an embedded chip 204 that may be adapted to store and/or update identification, operational-related and/or process-related information associated with the backing plate 202 and/or the target 236 in a manner similar to embedded chip 104 described above and shown in FIG. 1. For example, the embedded chip 204 may include information related to one or more of identification, service or maintenance, heat-up/cool down cycle, arcing and/or any other relevant information. Additionally or alternatively, the embedded chip 204 may store and/or update a larger or smaller amount of and/or different type of information.

The embedded chip 204 may be or include a microprocessor, microcontroller, one or more clocks, input/output ports (e.g., transmitter), sensors (e.g., pressure, temperature, etc.), or the like, and may be coupled to (and/or embedded in) the backing plate 202. The embedded chip 204 may be further coupled to the controller 252 and communicate information to the controller 252 as described above with reference to FIG. 1 and controller 106. For example, the embedded chip 204 may communicate with (and/or be coupled to) the controller 252 wirelessly, such as via RFID tagging or the like, or via one or more wires. The controller 252 may be internal or external to the chamber 200, and may comprise a microprocessor, microcontroller, one or more clocks, input/output ports, sensors, and/or the like.

When the material of target 236 has been consumed, a new target may be installed and coupled to the backing plate 202. The embedded chip 204 may, for example, store and/or update identification, operational-related and/or process-related information associated with the backing plate 202 and/or any (e.g., new) target attached to the backing plate 202.

Figure 3:
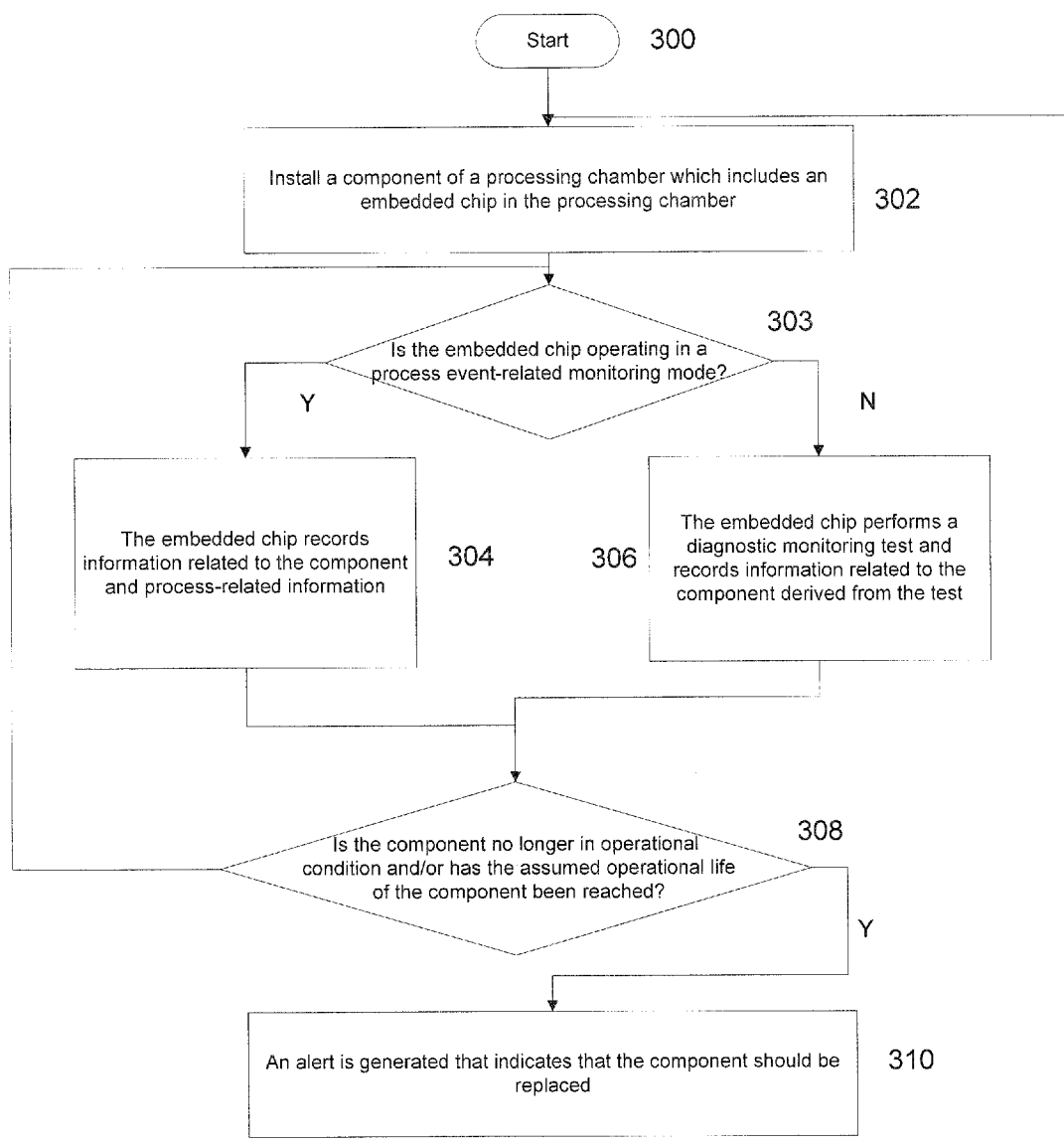
FIG. 3 is a flow chart of a method of using an embedded chip to monitor a component of a processing chamber provided in accordance with an embodiment of the present invention.

FIG. 3 is an exemplary flow chart of a processing chamber monitoring process utilizing a component having an embedded chip as provided according to the present invention. The process begins in step 300. In step 302, a component 202 of a processing chamber 200, such as a backing plate or substrate support, having an embedded chip 204 adapted to store and/or update identification, operational-related and/or process-related information associated with the component 202 is installed in the processing chamber 200. In step 303 it is determined whether the embedded chip is operating in a process event-related monitoring mode (Y) or a diagnostic monitoring mode (N). If it is decided that the embedded chip is operating in a process event-related monitoring mode, in step 304, a processing step is performed, such as a plasma vapor deposition onto a substrate 220, and the embedded chip 204 in the component 202 records information related to the component 202 (e.g., the component temperature, component integrity) and process related information such as the type of process performed, the process duration, materials used, etc.). The recording step may include tests to determine the operational condition of the component (e.g., by testing physical properties such as resistivity or the like). Alternatively, if it is determined in step 303 that the embedded chip is operating in a diagnostic mode, in step 306, a diagnostic monitoring test (e.g., a regularly scheduled test or user-initiated test) is performed and the embedded chip 204 in the component 202 records information related to the component 202, (e.g., whether the component 202 is in operational condition, the length of time the component has been installed within the processing chamber 200) without process-related information.

In step 308, it is determined (e.g., by a controller in communication with the embedded chip 204) whether the component 202 is no longer in operational condition and/or whether the assumed operational life of the component 202 has been reached. If either contingency applies, in step 310, an alert is generated indicating that the component 202 should be replaced. The method then cycles back to step 302 for installation of a new component. If neither contingency applies in step 308, the method cycles back for further process event-related monitoring or diagnostic tests, depending on the operating mode of the embedded chip (step 303).

The foregoing description discloses only exemplary embodiments of the invention. Modifications of the above disclosed apparatus and methods which fall within the scope of the invention will be readily apparent to those of ordinary skill in the art. For instance, an embedded chip 204 may be coupled to and/or included in other components such e.g., a liner, showerhead, target, etc. and may store and/or update identification, operational-related and/or process information associated with such components.

Accordingly, while the present invention has been disclosed in connection with exemplary embodiments thereof, it should be understood that other embodiments may fall within the spirit and scope of the invention, as defined by the following claims.

The invention claimed is:

1. A processing chamber for manufacturing one or more devices, comprising:
   a component for use during a process for manufacturing one or more devices performed within the processing chamber; and
   a chip embedded within the component, wherein the chip is adapted to store or update at least one of identification, operational-related and process-related information associated with the component;
   wherein the one or more devices are different from the component and the chip.

2. The processing chamber of claim 1, wherein the chip includes a memory component having at least one of flash memory, SRAM and DRAM.

3. The processing chamber of claim 1, further comprising:
   a controller communicatively coupled to the chip and adapted to receive the at least one of identification, operational-related and process-related information associated with the component from the chip;
   wherein the controller is adapted to determine an operational state of the component from the information received from the chip.

4. The processing chamber of claim 3, wherein the controller includes a processor.

5. The processing chamber of claim 1, wherein the component comprises a susceptor adapted to support a substrate.

6. The processing chamber of claim 1, wherein the component comprises a backing plate.

7. The processing chamber of claim 6, wherein the backing plate comprises a target including source material used for deposition onto a substrate, and the chip embedded in the backing plate is adapted to store information related to an amount of material that has been removed from the target during one or more deposition processes.

8. A component of a processing chamber for use during an electronic device manufacturing process performed within the processing chamber, the component comprising:
   at least one of a supporting surface and a housing; and
   a chip embedded in at least one of the supporting surface and the housing, wherein the chip is adapted to store or update at least one of identification, operational-related and process-related information associated with the at least one of the supporting surface and the housing.

9. The component of claim 8, wherein the chip includes a memory component having at least one of flash memory, SRAM and DRAM.

10. The component of claim 9, wherein the chip includes a communication unit adapted to wirelessly communicate the at least one of identification, operational-related and process-related information associated with the component.

11. The component of 10, wherein the at least one of a supporting surface and a housing comprises a susceptor adapted to support a substrate.

12. The component of claim 10, wherein the at least one of a support surface and a housing includes a backing plate including a target having source material for deposition onto a substrate.

13. The component of claim 12, wherein the chip embedded in the backing plate is adapted to store information related to an amount of material that has been removed from the target during one or more deposition processes.

14. A method of monitoring a component of a semiconductor processing chamber comprising:
    installing a component having an embedded chip in a semiconductor processing chamber used to manufacture one or more devices different from the component and the chip, the embedded chip having storage capacity;
    recording at least one of identification, operational-related and process-related information associated with the component within the chip; and
    communicating the updated information from the chip to enable determination of an operational state of the component.

15. The method of claim 14, wherein the communicating comprises transmitting the recorded information from the chip to a controller.

16. The method of claim 15, further comprising:
    determining, at the controller, from the information received from the chip whether:
    i) the component is no longer in operational condition; or
    ii) the assumed operational life of the component has been reached.

17. The method of claim 16, further comprising:
    if it is determined that either of i) or ii) applies, generating an alert indicating that the component should be replaced.

18. The method of claim 16, wherein the process-related information comprises a number of process events that have occurred since installation of the component.

19. The method of claim 16, wherein the operational-related information includes diagnostic information related to whether the component is in working condition.

20. The method of claim 14, further comprising:
    performing a diagnostic test on the component; and
    recording results of the diagnostic test within the embedded chip.

* * * * *